US012811603B2

(12) United States Patent
Wong et al.

(10) Patent No.: US 12,811,603 B2
(45) Date of Patent: Nov. 24, 2026

(54) EQUAL PROBABILITY DYNAMIC ELEMENT MATCHING

(71) Applicant: Avago Technologies International Sales Pte. Limited, Singapore (SG)

(72) Inventors: Koon Lun Wong, Irvine, CA (US); Chi-Hung Lin, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 109 days.

(21) Appl. No.: 18/991,009

(22) Filed: Dec. 20, 2024

(65) Prior Publication Data

US 2026/0180592 A1 Jun. 25, 2026

(51) Int. Cl.
*H03M 1/66* (2006.01)
*H03M 1/70* (2006.01)

(52) U.S. Cl.
CPC .................................... *H03M 1/70* (2013.01)

(58) Field of Classification Search
CPC ...... H03M 1/0665; H03M 1/747; H03M 1/66; H03M 3/502; H03M 1/74; H03M 1/066; H03M 1/0673; H03M 1/0663; H03M 1/361; H03M 1/662; H03M 3/464; H03M 1/0604; H03M 1/0614; H03M 1/0631; H03M 1/0651; H03M 1/0653; H03M 1/067; H03M 1/0682; H03M 1/1014; H03M 1/1019; H03M 1/1071; H03M 1/1215; H03M 1/167; H03M 1/447; H03M 1/661; H03M 1/68; H03M 1/682; H03M 1/687; H03M 1/742; H03M 3/30; H03M 3/338; H03M 3/39; H03M 3/50
USPC .......................................... 341/144, 118–121
See application file for complete search history.

(56) References Cited

U.S. PATENT DOCUMENTS

| | | | | |
|---|---|---|---|---|
| 6,124,813 A * | 9/2000 | Robertson | H03M 1/0665 341/143 |
| 6,819,276 B1 * | 11/2004 | Hossack | H03M 1/0673 341/143 |
| 9,584,151 B1 * | 2/2017 | Manganaro | H03M 1/0863 |
| 9,966,969 B1 * | 5/2018 | Engel | H03M 1/662 |
| 2004/0246155 A1 * | 12/2004 | Huang | H03M 1/0673 341/144 |
| 2008/0143572 A1 * | 6/2008 | Magrath | H03M 1/0665 341/144 |

(Continued)

OTHER PUBLICATIONS

Wei-Te Lin et al., "A 12-bit 40 nm DAC Achieving SFDR > 70 dB at 1.6 GS/s and IMD < -61dB at 2.8 GS/s With DEMDRZ Technique", IEEE Journal of Solid-State Circuits, vol. 49, No. 3, Mar. 2014, pp. 708-717.

(Continued)

*Primary Examiner* — Linh V Nguyen
(74) *Attorney, Agent, or Firm* — Quarles & Brady LLP

(57) ABSTRACT

Equal probability dynamic element matching functionality for use in various types of integrated circuits (e.g., communications circuits, etc.). The equal probability dynamic element matching functionality generally includes arranging circuit elements in a loop, and using both a pointer and a random number having a binary value to provide equal selection of circuit elements in the loop over time. The equal probability dynamic element matching functionality can be used to improve performance and durability of various types of integrated circuits.

20 Claims, 6 Drawing Sheets

(56) References Cited

U.S. PATENT DOCUMENTS

| | | | | |
|---|---|---|---|---|
| 2009/0085783 | A1* | 4/2009 | Kim .................... | H03M 1/0665<br>341/126 |
| 2010/0149012 | A1* | 6/2010 | Nguyen ............. | H03M 1/0663<br>341/143 |
| 2012/0229315 | A1* | 9/2012 | Tseng .................. | H03M 1/0641<br>341/145 |
| 2013/0141265 | A1* | 6/2013 | Lee ..................... | H03M 1/1019<br>341/144 |
| 2015/0171880 | A1* | 6/2015 | Caldwell ............. | H03M 1/0673<br>341/126 |

OTHER PUBLICATIONS

Extended European Search Report for Patent Application No. 25224310.0 dated Jun. 10, 2026, 12 pages.

Kim, Jaekwon et al., “Design and Analysis of a 12-b Current-Steering DAC in a 14-nm FinFET Technology for 2G/3G/4G Cellular Applications”, IEEE Transactions on Circuits and Systems I, Regular Papers, vol. 66, No. 10, Oct. 2019, pp. 3723-3732.

* cited by examiner

EQUAL PROBABILITY DYNAMIC ELEMENT MATCHING

BACKGROUND

The present disclosure relates, in general, to integrated circuit design and functionality. More specifically, the present disclosure pertains to devices, circuits, methods, and media for providing equal probability dynamic element matching in various applications. The technology detailed in the present disclosure can be used with various types of communications circuits, among other possible types of circuits.

DETAILED DESCRIPTION

Figure 1:
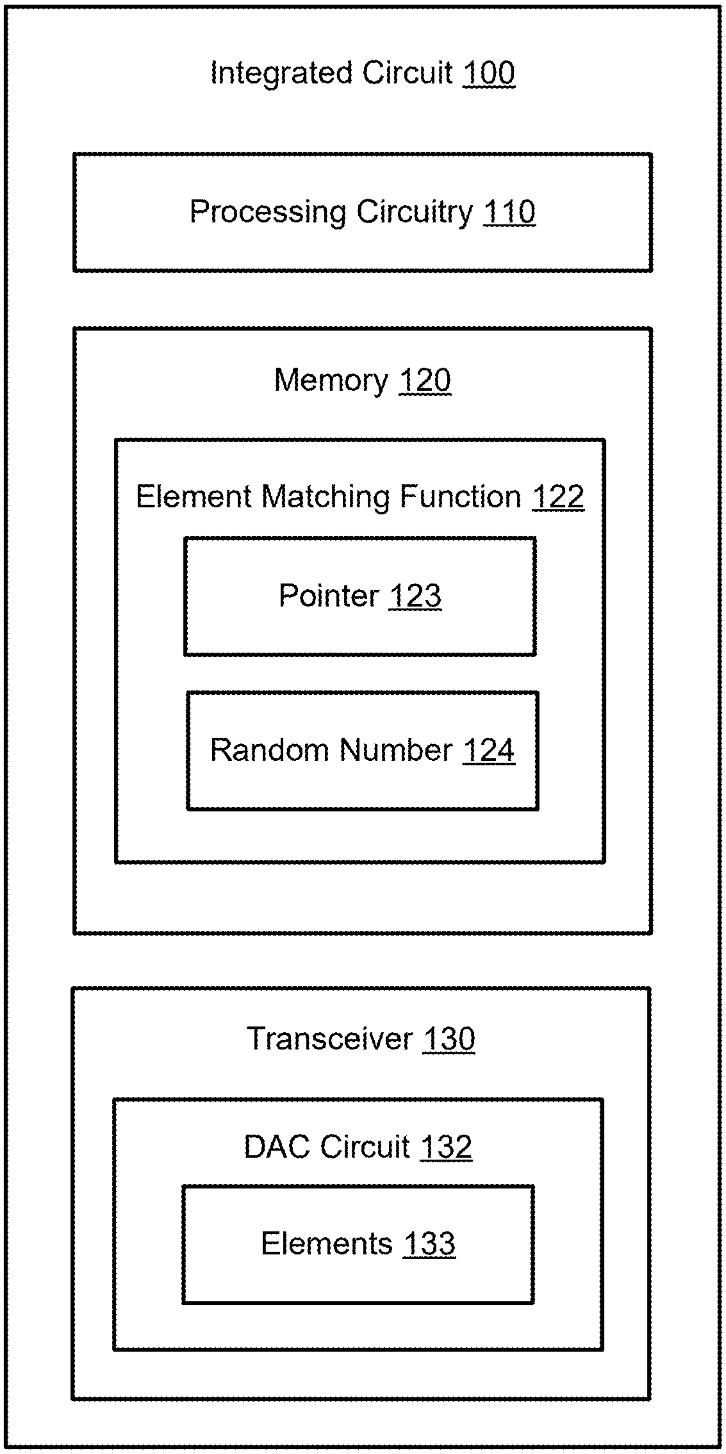
FIG. 1 shows a block diagram illustrating components of an example integrated circuit, in accordance with some aspects of the disclosure.

In the following description, for the purposes of explanation, numerous details are set forth to provide a thorough understanding of the disclosure. It will be apparent to one skilled in the art, however, that other aspects can be practiced without some details. Different examples are described herein, and while various features are ascribed to the examples, it should be appreciated that the features described with respect to one example may be incorporated with other examples as well. By the same token, however, no single feature or features of any described example should be considered essential to every example, as other examples may omit such features.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

When an element is referred to herein as being "disposed" in some manner relative to another element (e.g., disposed on, disposed between, disposed under, disposed adjacent to, or disposed in some other relative manner), it is to be understood that the elements can be directly disposed relative to the other element (e.g., disposed directly on another element), or have intervening elements present between the elements. In contrast, when an element is referred to as being "disposed directly" relative to another element, it should be understood that no intervening elements are present in the "direct" example. However, the existence of a direct disposition does not exclude other examples in which intervening elements may be present.

Likewise, when an element is referred to herein as being a "layer", it is to be understood that the layer can be a single layer or include multiple layers. For example, a conductive layer can include multiple different conductive materials or multiple layers of different conductive materials, and a dielectric layer may comprise multiple dielectric materials or multiple layers of dielectric materials. When a layer is described as being coupled or connected to another layer, it is to be understood that the coupled or connected layers may include intervening elements present between the coupled or connected layers. In contrast, when a layer is referred to as being "directly" connected or coupled to another layer, it should be understood that no intervening elements are present between the layers. However, the existence of directly coupled or connected layers does not exclude other connections in which intervening elements may be present.

Moreover, the terms left, right, front, back, top, bottom, forward, reverse, clockwise and counterclockwise are used for purposes of explanation only and are not limited to any fixed direction or orientation. Rather, they are used merely to indicate relative locations and/or directions between various parts of an object and/or components.

Furthermore, unless otherwise indicated, all numbers used herein to express quantities, dimensions, and so forth should be understood as being modified in all instances by the term "about". In this application, the use of the singular includes the plural unless specifically stated otherwise, and use of the terms "and" and "or" means "and/or" unless otherwise indicated. Moreover, the use of the terms "including" and "having", as well as other forms, such as "includes", "included", "has", "have", and "had", should be considered non-exclusive. Also, terms such as "element" or "component" encompass both elements and components comprising one unit and elements and components that comprise more than one unit, unless specifically stated otherwise.

While some features and aspects have been described with respect to the examples, one skilled in the art will recognize that numerous modifications are possible. For example, the methods and processes described herein may be implemented using hardware components, custom integrated circuits (ICs), programmable logic, and/or any combination thereof. Further, while various methods and processes described herein may be described with respect to particular structural and/or functional components for ease of description, methods provided by various embodiments are not limited to any particular structural and/or functional architecture but instead can be implemented in any suitable hardware configuration. Similarly, while some functionality is ascribed to one or more system components, unless the context dictates otherwise, this functionality can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various implementations. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various examples are described with or without some features for ease of description and to illustrate aspects of those embodiments, the various components and/or features described herein with respect to a particular example can be substituted, added and/or subtracted from among other described embodiments, unless the context dictates otherwise. Consequently, although several examples are described above, it will be appreciated that the disclosure is intended to cover all modifications and equivalents within the scope of the following claims.

Referring to FIG. 1, a block diagram illustrating components of an example integrated circuit 100 is shown, in accordance with some aspects of the disclosure. The integrated circuit 100 can be implemented using various suitable types of integrated circuits, including various suitable types of communications circuits. For example, the integrated circuit 100 can be implemented as an Ethernet circuit (e.g., an Ethernet switching circuit, an Ethernet routing circuit, an Ethernet network adapter circuit, an Ethernet physical layer (PHY) circuit, a Power over Ethernet (PoE) circuit, etc.) or as another type of communications circuit. The integrated circuit 100 can be used in various suitable applications including various automative applications, personal computing applications, and data center applications, among other possible applications. As shown in FIG. 1, the integrated circuit 100 can include processing circuitry 110, memory 120, and a transceiver 130.

The processing circuitry 110 can be implemented using any suitable types of processing circuitry (e.g., one or more central processing units (CPUs), one or more graphics processing units (GPUs), etc.) with any suitable configuration of processing cores. The memory 120 can likewise be implemented using any suitable types of memory (e.g., volatile, non-volatile, random-access memory (RAM), read-only memory (ROM), electrically erasable programmable read-only memory (EEPROM), etc.). The memory 120 can include one or more non-transitory machine-readable storage media having instructions stored thereon that, when executed by the processing circuitry 110, cause the processing circuitry to perform various operations in accordance with the instructions. For example, the memory 120 can include instructions executable by the processing circuitry 110 to implement an element matching function 122. The element matching function 122 can be an equal probability dynamic element matching (DEM) function, for example. The element matching function 122 can be used to at least partially match the elements 133. As shown in FIG. 1, the element matching function 122 can use both a pointer 123 and a random number 124 to perform the equal probability dynamic element matching functionality. The random number 124 can be used to increment the pointer 123 and can have a binary value (e.g., 1 or 0). The pointer 123 can be used to select one of the elements 133 as part of the element matching function 122.

The transceiver 130 can also be implemented using various suitable types of transceiver circuits and associated components. In some examples, depending on the intended application of the integrated circuit 100, the transceiver 130 can be implemented as a transmitter only, or as a receiver only, instead of a combined transmitter and receiver. The transceiver 130 can facilitate electronic communications in accordance with a variety of suitable communications protocols and standards. For example, the transceiver 130 can facilitate communications using protocols such as 1G Ethernet (Gigabit Ethernet), 2.5G Ethernet, 5G Ethernet, 10G Ethernet, and/or other suitable communications protocols and standards. The functionality provided by the element matching function 122 can allow the integrated circuit 100 to be backwards compatible with more "legacy" products and protocols, such as 1G Ethernet.

As shown in FIG. 1, the transceiver 130 can include a digital-to-analog converter (DAC) circuit 132, and the digital-to-analog converter circuit 132 can include various suitable types of circuit elements 133. For example, the elements 133 of the digital-to-analog converter circuit 132 can consist essentially of or can include various suitable types of switching elements. In some examples, to provide certain advantages in terms of manufacturing feasibility and efficiency, the switching elements can be transistor elements, such as complementary metal-oxide semiconductor (CMOS) transistor elements, for example. The elements 133 can switched on and off (e.g., by the processing circuitry 110) to control the current flow within the digital-to-analog converter circuit 132 and ultimately convert an input digital signal to an output analog signal. The elements 133 can include any suitable number of integer elements.

In many communications applications, the digital-to-analog converter circuit 132 can receive an input signal that is a three digit digital input signal (e.g., three bits), and the elements 133 can consist essentially of seven switching elements. In such applications, various dynamic element matching techniques can be used to improve the linearity of the digital-to-analog converter by dynamically swapping (shuffling) the elements of the digital-to-analog converter that are under stress during operation. However, pervious dynamic element matching techniques face challenges due to the fact that the digital-to-analog converter includes $2^{N-1}$ elements, and therefore the number of elements cannot be evenly divided by 2 (the base of a binary number). In some of these previous approaches to using dynamic element matching, an N-bit binary number may be used to represent a random number. For, example, a three digit binary number may be used to represent a random number. However, in such scenarios, the number of possible states of the random number (e.g., 8) is not equal to the number of elements in the digital-to-analog converter. Accordingly, the resulting distribution of elements will not be equal, since the random number leads to at least one of the elements having a higher probability of being selected than the others.

To solve this problem and provide equal probability dynamic element matching for any suitable number of elements, the element matching function 122 can arrange the elements 133 in a loop, and use the pointer 123 and the random number 124 to select from the elements 133 in a manner such that each of the elements 133 has an equal probability of being selected. As a result, the integrated circuit 100 can mitigate device stressing (e.g., stress on the elements 133) that may occur due to large signal swings. For example, the use of some legacy communications products and standards (e.g., 1G Ethernet) can involve high output swing requirements (e.g., a differential of 4.9 volts peak-to-peak) during full duplex operation. The use of modern CMOS technologies to fabricate the integrated circuit 100 (and the elements 133) can create challenges in these types of applications due to the low voltage tolerance of such CMOS devices. By making the probability distribution equal across all of the elements 133 using the element matching function 122, the chances of damage occurring to any of the elements 133 as a result of high voltage stress can be significantly reduced.

Figure 2A:
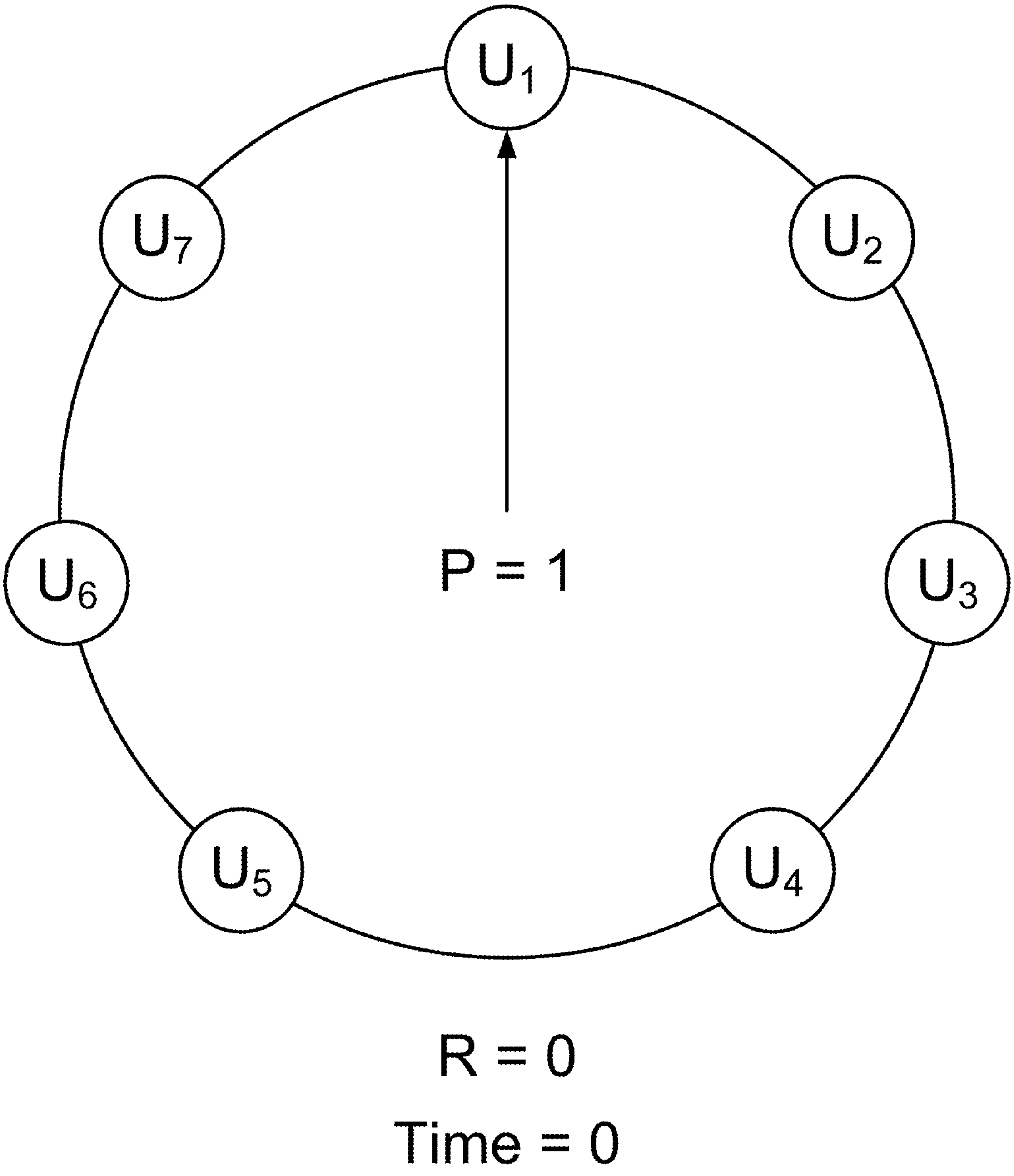
FIG. 2A shows a diagram of elements of the integrated circuit of FIG. 1 during an initialization time period associated with an element matching function, in accordance with some aspects of the disclosure.

Referring to FIGS. 2A-2E, various example diagrams are provided to help illustrate the functionality of the element matching function 122 that can be executed by the processing circuitry 110, in accordance with some aspects of the disclosure. Turning to FIG. 2A, a diagram associated with an initialization time period (Time=0) is shown. In the diagram in FIG. 2A, the elements 133 include 7 separate elements $U_1$, $U_2$, $U_3$, $U_4$, $U_5$, $U_6$, and $U_7$ that are arranged in a loop. The loop arrangement of the elements 133 can be implemented in various suitable ways (e.g., using an array, etc.) within the integrated circuit 100, and the intended meaning of the loop arrangement of the elements 133 will become apparent with the following description of the element matching function 122. During the initialization time period, the pointer 123 can be set to 1 (P=1) and the random number 124 can be set to zero (R=0), as shown in FIG. 2A. The initialization time period can be any suitable period of time, depending on the intended application of the integrated circuit 100. In general, the time periods as described with respect to FIGS. 2A-2E can be clock cycles associated with the integrated circuit 100 (e.g., the clock signal of the digital-to-analog converter 132), for example, among other possible types of time periods. As such, the time periods described with respect to FIGS. 2A-2E can be implemented using any suitable length time periods.

Figure 2B:
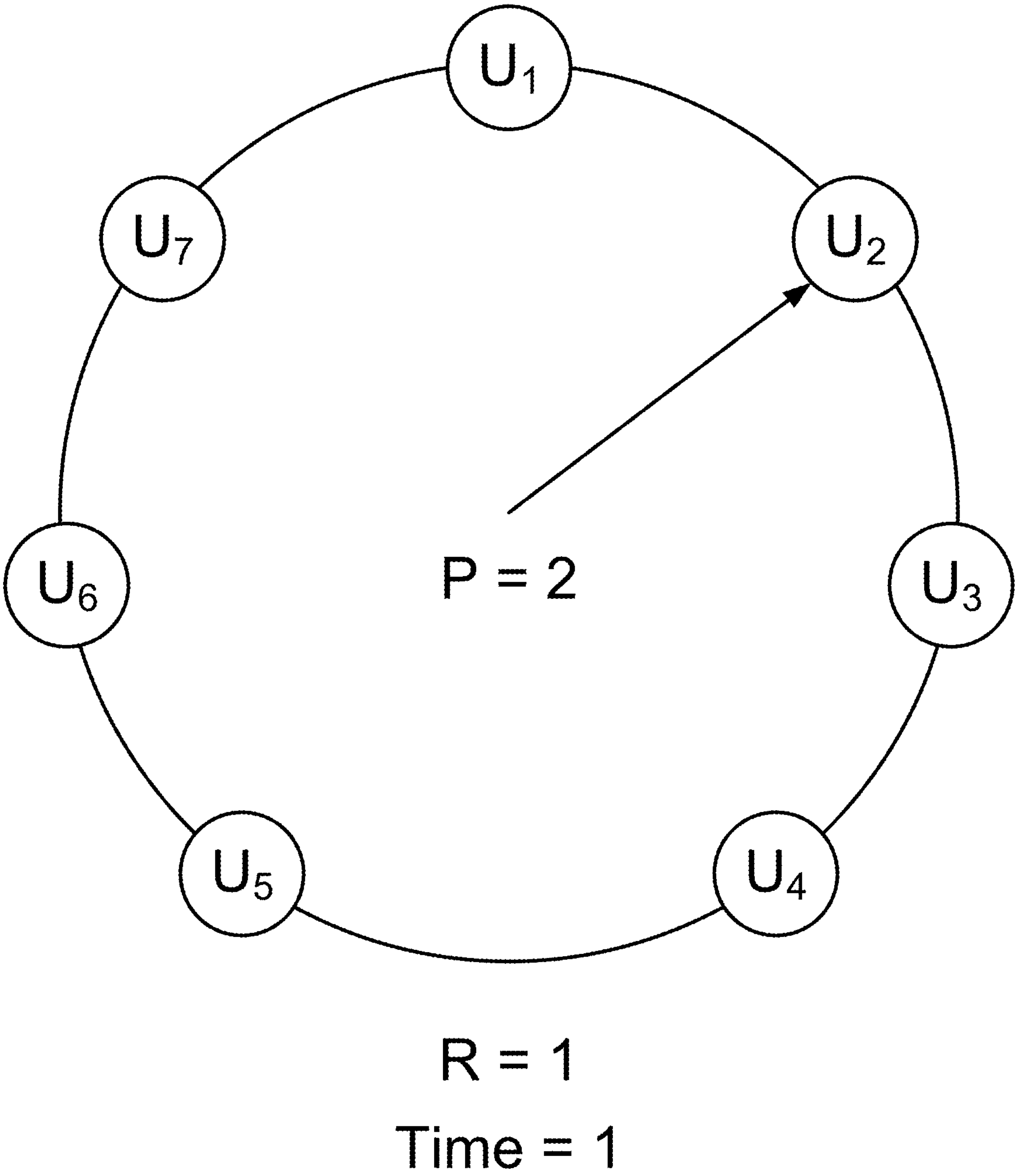
FIG. 2B shows a diagram of elements of the integrated circuit of FIG. 1 during a first time period associated with an element matching function, in accordance with some aspects of the disclosure.

Turning to FIG. 2B, a diagram associated with a first time period (Time=1) is shown. During the first time period, the random number 124 can be reset in a manner such that there is equal probability that the random number 124 gets reset to 1 and that the random number 124 gets reset to 0 (e.g., 50% chance that the binary value gets reset to 1, 50% chance the binary value gets reset to 0). If the random number 124 gets reset to 1 during the first time period, the processing circuitry 110 can increment the pointer 123. However, if the random number 124 gets reset to 0 during the first time period, the processing circuitry 110 can leave the pointer 123 unchanged. This functionality can also be reversed, such that the pointer 123 is incremented if the random number 124 gets reset to 0 and the pointer 123 is left unchanged if the random number 124 gets reset to 1. In the example shown in FIG. 2B, the random number 124 gets reset to 1 (R=1) during the first time period, and the pointer 123 is incremented (P=2). As a result of incrementing the pointer 123 during the first time period, the pointer 123 now points to the second element $U_2$ that is adjacent to the first element $U_1$ in the loop. However, this functionality could also be reversed such that the pointer 123 moves in the opposite direction (e.g., the pointer 123 could be incremented to the seventh element $U_7$ that is also adjacent to the first element $U_1$ in the loop) when incremented.

The pointer 123 can generally be used to select one of the elements 133 of the digital-to-analog converter circuit 132 as an initial element in the element matching function 122 that corresponds to a first digit (e.g., the least significant digit) of an input signal received by the digital-to-analog converter circuit 132. For example, if the input signal received by the digital-to-analog converter circuit 132 is a three digit binary number (e.g., $B_3B_2B_1$), the pointer 123 can point to the first element to be used by $B_1$. When the pointer 123 is initialized (P=1), the element $U_1$ can be used by $B_1$, such that the element $U_1$ can be turned on and off by $B_1$. Also, when the pointer 123 is initialized (P=1), $B_2$ can control (e.g., turn on and off) both of the elements $U_2$ and $U_3$, and $B_3$ can control (e.g., turn on and off) each of the elements $U_4$, $U_5$, $U_6$, and $U_7$. Then, when the pointer 123 gets incremented based on the random number 124 during a subsequent time period (e.g., a subsequent clock cycle), the pointer 123 can be used to select a different element (e.g., $U_2$) as the initial element in the element matching function 122 that corresponds to a first digit (e.g., the least significant digit) of the input signal that is received by the digital-to-analog converter circuit 132 and converted to an analog signal. Other possible approaches to the use of the pointer to select a particular one of the element 133 can also be implemented.

Figure 2C:
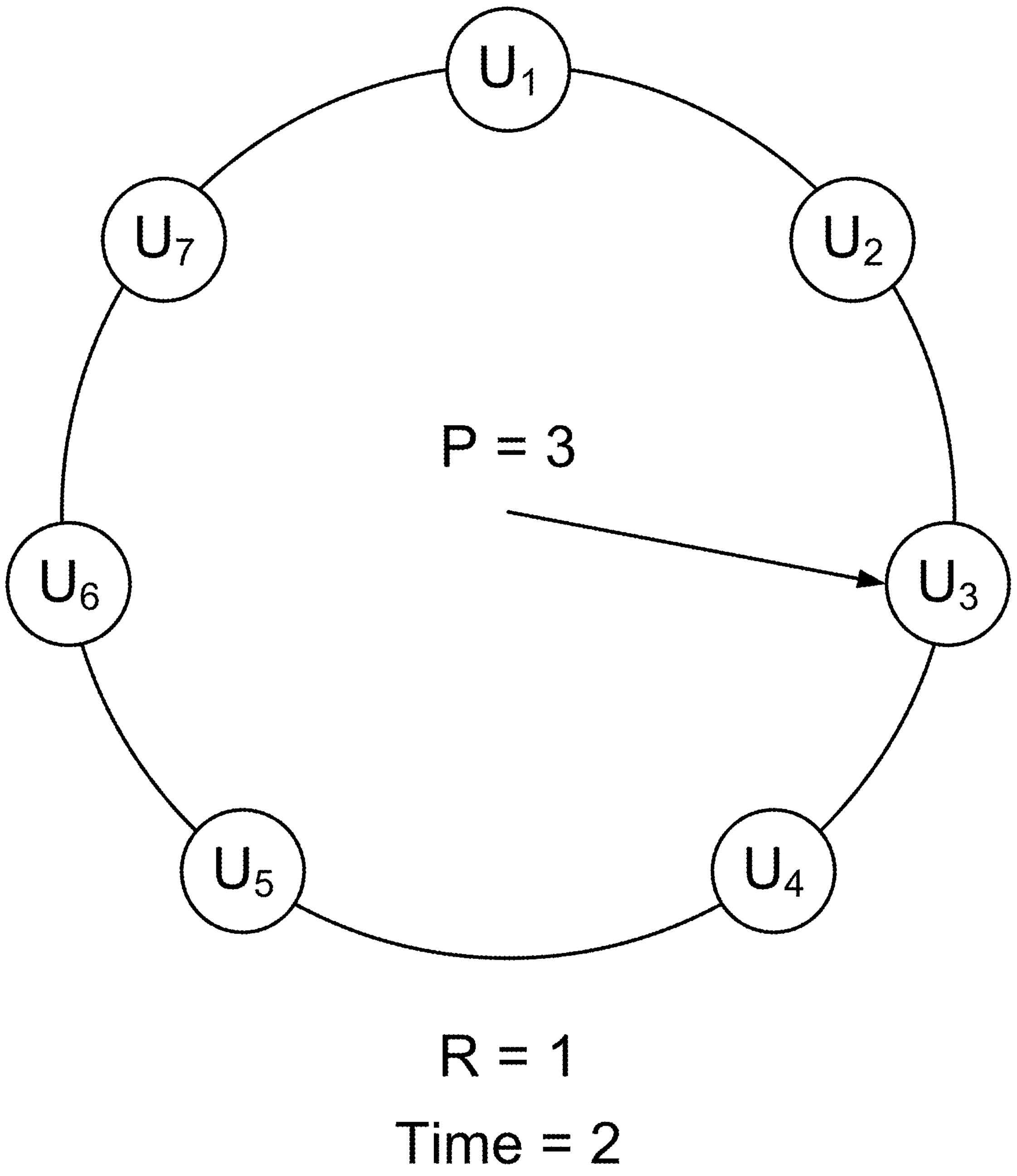
FIG. 2C shows a diagram of elements of the integrated circuit of FIG. 1 during a second time period associated with an element matching function, in accordance with some aspects of the disclosure.

Turning to FIG. 2C, a diagram associated with a second time period (Time=2) is shown. During the second time period, the random number 124 can again be reset in a manner such that there is equal probability that the random number 124 gets reset to 1 and that the random number 124 gets reset to 0 (e.g., 50% chance that the binary value gets reset to 1, 50% chance the binary value gets reset to 0). If the random number 124 gets reset to 1 during the second time period, the processing circuitry 110 can increment the pointer 123. However, if the random number 124 gets reset to 0 during the second time period, the processing circuitry 110 can leave the pointer 123 unchanged. In the example shown in FIG. 2C, the random number 124 again gets reset to 1 (R=1) during the second time period, and the pointer 123 is again incremented (P=3). As a result of incrementing the pointer 123 during the second time period, the pointer 123 now points to the third element $U_3$ that is adjacent to the second element $U_2$ in the loop. Accordingly, the third element $U_3$ can be selected as the initial element in the element matching function 122 that corresponds to the first digit (e.g., the least significant digit) of the input signal received by the digital-to-analog converter circuit 132.

Figure 2D:
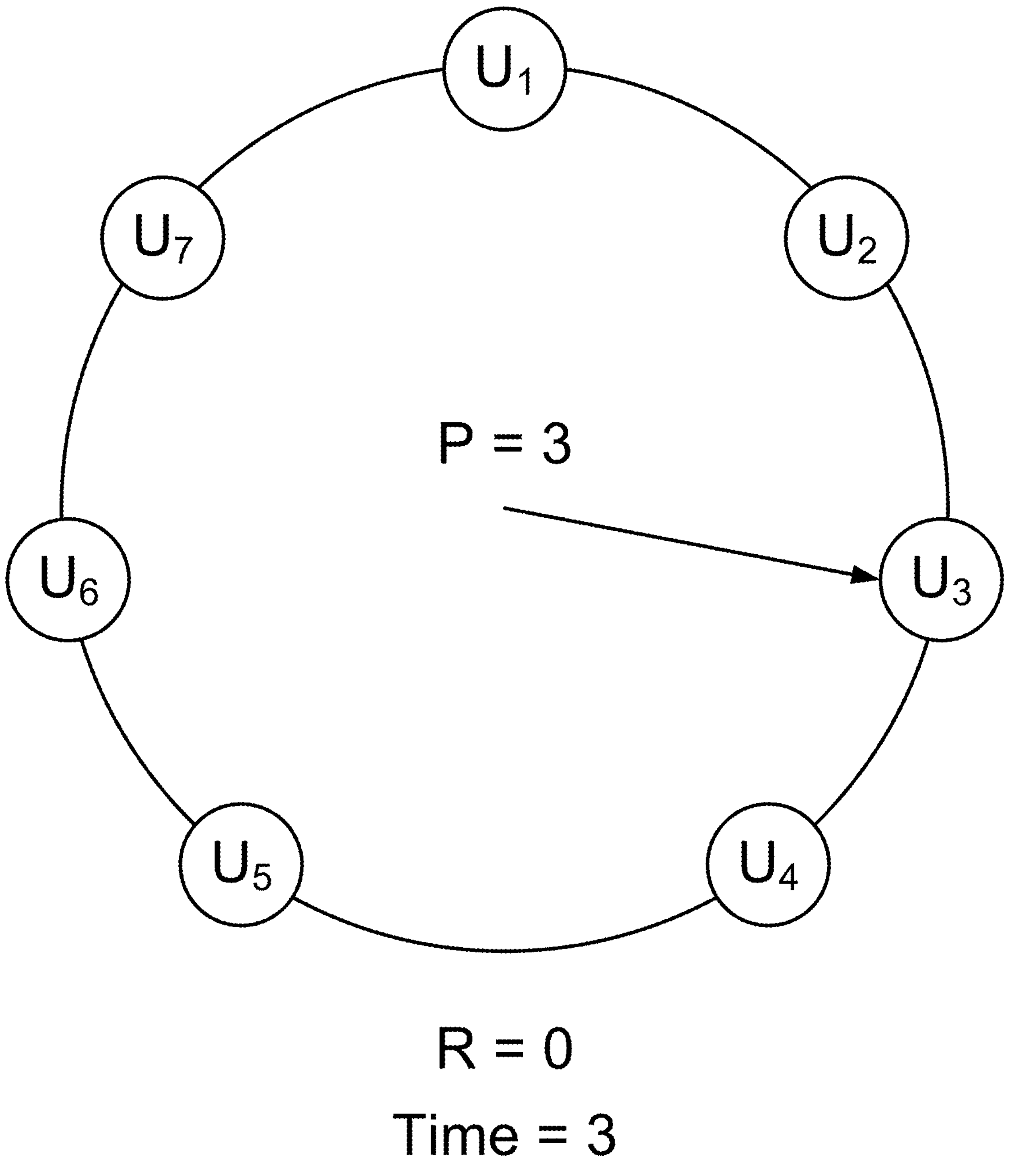
FIG. 2D shows a diagram of elements of the integrated circuit of FIG. 1 during a third time period associated with an element matching function, in accordance with some aspects of the disclosure.

Turning to FIG. 2D, a diagram associated with a third time period (Time=3) is shown. During the third time period, the random number 124 can again be reset in a manner such that there is equal probability that the random number 124 gets reset to 1 and that the random number 124 gets reset to 0 (e.g., 50% chance that the binary value gets reset to 1, 50% chance the binary value gets reset to 0). If the random number 124 gets reset to 1 during the third time period, the processing circuitry 110 can increment the pointer 123. However, if the random number 124 gets reset to 0 during the third time period, the processing circuitry 110 can leave the pointer 123 unchanged. In the example shown in FIG. 2D, the random number 124 gets reset to 0 (R=0) during the third time period, and the pointer 123 remains unchanged (P=3). As a result of leaving the pointer 123 unchanged during the third time period, the pointer 123 remains pointing to the third element $U_3$ that is adjacent to the second element $U_2$ in the loop. As such, the third element $U_3$ can remain selected as the initial element in the element matching function 122 that corresponds to the first digit (e.g., the least significant digit) of the input signal received by the digital-to-analog converter circuit 132.

Figure 2E:
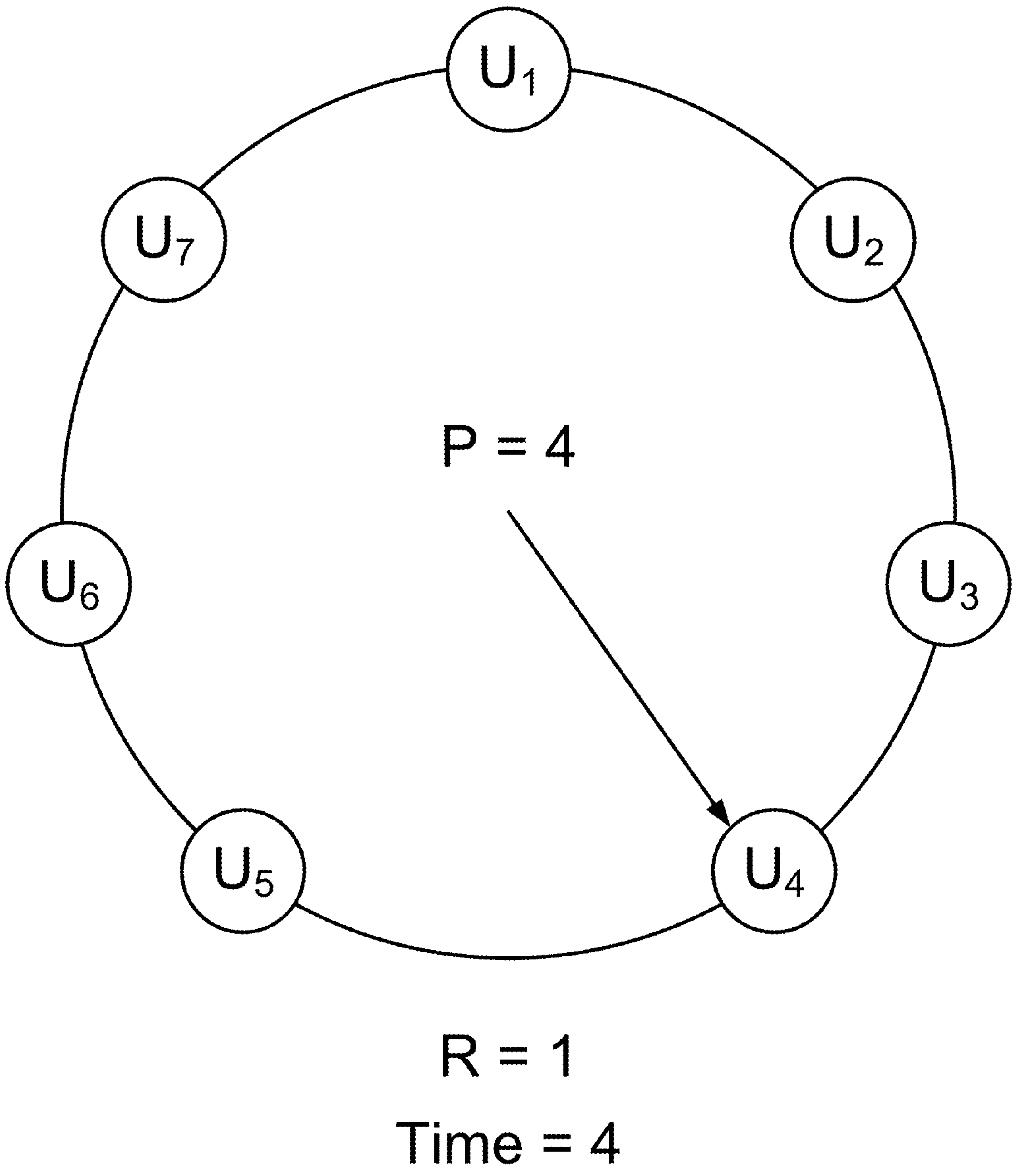
FIG. 2E shows a diagram of elements of the integrated circuit of FIG. 1 during a fourth time period associated with an element matching function, in accordance with some aspects of the disclosure.

Turning to FIG. 2E, a diagram associated with a fourth time period (Time=4) is shown. During the fourth time period, the random number 124 can yet again be reset in a manner such that there is equal probability that the random number 124 gets reset to 1 and that the random number 124 gets reset to 0 (e.g., 50% chance that the binary value gets reset to 1, 50% chance the binary value gets reset to 0). If the random number 124 gets reset to 1 during the fourth time period, the processing circuitry 110 can increment the pointer 123. However, if the random number 124 gets reset to 0 during the fourth time period, the processing circuitry

110 can leave the pointer 123 unchanged. In the example shown in FIG. 2E, the random number 124 again gets reset to 1 (R=1) during the fourth time period, and the pointer 123 is again incremented (P=4). As a result of incrementing the pointer 123 during the fourth time period, the pointer 123 now points to the fourth element $U_4$ that is adjacent to the third element $U_3$ in the loop. Accordingly, the fourth element $U_4$ can be selected as the initial element in the element matching function 122 that corresponds to the first digit (e.g., the least significant digit) of the input signal received by the digital-to-analog converter circuit 132.

This process as illustrated with respect to FIGS. 2A-2E can continue as part of the execution of the element matching function 122 by the processing circuitry 110 such that, over time, there is an equal probability of selecting each of the 7 separate elements $U_1$, $U_2$, $U_3$, $U_4$, $U_5$, $U_6$, and $U_7$ that are arranged in a loop. As noted, the element matching function 122 can be adapted for use with any suitable integer number of elements, including prime numbers, and the element matching function 122 can still guarantee this equal probability distribution. Further, the random number 124 can be adapted to be a multi-bit number, and the probability of each shuffle pattern being used can remain the same, as long as the random number 124 maintains an even probability distribution. The element matching function 122 can be implemented and operated at high clock frequencies (e.g., multi gigahertz (GHz) frequencies) due to the simplistic nature of the logic.

Additionally, the elements 133 can be expressed as a straight line with the assumption of wrap around, such that the elements 133 are not necessarily expressed in a circular shape such as shown in the example diagrams of FIGS. 2A-2E. In some examples, the pointer 123 can be updated (and the random number 124 can be reset) at a frequency that is different from a clock frequency associated with the integrated circuit 100 (e.g., the clock signal of the digital-to-analog converter 132), and the equal probability distribution characteristic can remain unchanged. The ability to implement the element matching function 122 at a slower rate in this manner can provide, in some applications, advantages in terms of noise reduction. Further, the same or a similar approach can be used with an analog-to-digital (ADC) converter circuit (among other types of circuits that may benefit from element matching functionality) in place of the digital-to-analog converter circuit 132.

The invention claimed is:

1. An integrated circuit, comprising:
- a digital-to-analog converter circuit;
- memory comprising instructions executable to implement an element matching function associated with the digital-to-analog converter circuit; and
- processing circuitry configured to execute the instructions in the memory to implement the element matching function by:
  - arranging elements of the digital-to-analog converter circuit in a loop;
  - initiating a pointer that is used to select one of the elements of the digital-to-analog converter circuit as part of the element matching function such that the pointer has a first value associated with a first element of the elements of the digital-to-analog converter circuit;
  - initiating a random number that is used to increment the pointer and has a binary value;
  - during a first time period, resetting the random number with equal probability that the binary value is reset to on and to off;
  - during the first time period, incrementing the pointer to a second value associated with a second element of the elements of the digital-to-analog converter circuit arranged adjacent to the first element in the loop responsive to determining that the binary value has been reset to on during the first time period;
  - during a second time period, resetting the random number with equal probability that the binary value is reset to on and to off; and
  - during the second time period, leaving the pointer unchanged responsive to determining that the binary value has been reset to off during the second time period.

2. The integrated circuit of claim 1, wherein the first time period comprises a first clock cycle and the second time period comprises a second clock cycle.

3. The integrated circuit of claim 1, wherein the integrated circuit comprises an Ethernet circuit, and wherein the digital-to-analog converter circuit is part of a transceiver of the Ethernet circuit.

4. The integrated circuit of claim 1, wherein the elements of the digital-to-analog converter circuit comprise transistor elements.

5. The integrated circuit of claim 4, wherein the transistor elements comprise complementary metal-oxide semiconductor (CMOS) transistor elements.

6. The integrated circuit of claim 1, wherein the pointer is used to select one of the elements of the digital-to-analog converter circuit as an initial element in the element matching function that corresponds to a first digit of an input signal received by the digital-to-analog converter circuit.

7. The integrated circuit of claim 6, wherein:
- the input signal comprises a three digit digital input signal; and
- the digital-to-analog converter circuit consists essentially of seven elements.

8. A method for element matching in an integrated circuit comprising a digital-to-analog converter, the method comprising:
- arranging elements of the digital-to-analog converter circuit in a loop;
- initiating a pointer used to select one of the elements of the digital-to-analog converter circuit such that the pointer has a first value associated with a first element of the elements of the digital-to-analog converter circuit;
- initiating a random number that is used to increment the pointer and has a binary value;
- during a first time period, resetting the random number such that there is equal probability that the binary value is reset to on and to off during the first time period;
- during the first time period, incrementing the pointer to a second value associated with a second element of the elements of the digital-to-analog converter circuit arranged adjacent to the first element in the loop responsive to determining that the binary value has been reset to off during the first time period;
- during a second time period, resetting the random number such that there is equal probability that the binary value is reset to on and to off during the second time period; and
- during the second time period, leaving the pointer unchanged responsive to determining that the binary value has been reset to on during the second time period.

9. The method of claim 8, wherein the first time period comprises a first clock cycle and the second time period comprises a second clock cycle.

10. The method of claim 8, wherein the integrated circuit comprises a communications circuit, and wherein the digital-to-analog converter circuit is part of a transceiver of the communications circuit.

11. The method of claim 8, wherein the elements of the digital-to-analog converter circuit comprise complementary metal-oxide semiconductor (CMOS) transistor elements.

12. The method of claim 8, comprising:

during a third time period, resetting the random number such that there is equal probability that the binary value changes after being reset during the third time period; and during the third time period, incrementing the pointer to a third value associated with a third element of the elements of the digital-to-analog converter circuit arranged adjacent to the second element in the loop responsive to determining that the random number has changed after being reset during the first time period.

13. The method of claim 12, comprising:

during a fourth time period, resetting the random number such that there is equal probability that the binary value changes after being reset during the fourth time period; and during the fourth time period, leaving the pointer unchanged responsive to determining that the random number has not changed after being reset during the fourth time period.

14. The method of claim 8, wherein the pointer is used to select one of the elements of the digital-to-analog converter circuit as an initial element that corresponds to a first digit of an input signal received by the digital-to-analog converter circuit.

15. A non-transitory computer-readable storage medium comprising instructions stored thereon that, when executed by processing circuitry, cause the processing circuitry to:

arrange elements of a digital-to-analog converter circuit in a loop;

initiate a pointer used to select one of the elements of the digital-to-analog converter circuit such that the pointer has a first value associated with a first element of the elements of the digital-to-analog converter circuit;

initiate a random number that is used to increment the pointer and has a binary value;

during a first time period, reset the random number such that there is equal probability that the binary value is reset to on and to off during the first time period;

during the first time period, increment the pointer to a second value associated with a second element of the elements of the digital-to-analog converter circuit arranged adjacent to the first element in the loop responsive to determining that the binary value has been reset to on during the first time period;

during a second time period, reset the random number such that there is equal probability that the binary value is reset to on and to off during the second time period; and during the second time period, leave the pointer unchanged responsive to determining that the binary value has been reset to off during the second time period.

16. The computer-readable storage medium of claim 15, wherein the first time period comprises a first clock cycle and the second time period comprises a second clock cycle.

17. The computer-readable storage medium of claim 15, wherein the digital-to-analog converter circuit is part of a transceiver of a communications circuit.

18. The computer-readable storage medium of claim 15, wherein the elements of the digital-to-analog converter circuit comprise switching elements.

19. The computer-readable storage medium of claim 18, wherein the switching elements comprise complementary metal-oxide semiconductor (CMOS) transistor elements.

20. The computer-readable storage medium of claim 15, wherein the pointer is used to select one of the elements of the digital-to-analog converter circuit as an initial element that corresponds to a first digit of an input signal received by the digital-to-analog converter circuit.

* * * * *